United States Patent
Hook et al.

(10) Patent No.: US 11,251,179 B2
(45) Date of Patent: Feb. 15, 2022

(54) LONG CHANNEL AND SHORT CHANNEL VERTICAL FET CO-INTEGRATION FOR VERTICAL FET VTFET

(71) Applicant: International Business Machines Corporation, Armonk, NY (US)

(72) Inventors: Terence B. Hook, Jericho, VT (US); Baozhen Li, South Burlington, VT (US); Kirk David Peterson, Jericho, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/199,694

(22) Filed: Jun. 30, 2016

(65) Prior Publication Data

US 2018/0006025 A1  Jan. 4, 2018

(51) Int. Cl.
*H01L 21/8234* (2006.01)
*H01L 27/088* (2006.01)
*H01L 29/78* (2006.01)
*H01L 29/66* (2006.01)

(52) U.S. Cl.
CPC .... *H01L 27/088* (2013.01); *H01L 21/823418* (2013.01); *H01L 21/823437* (2013.01); *H01L 21/823475* (2013.01); *H01L 21/823487* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,212,311 B2 | 7/2012 | Masuoka et al. | |
| 8,907,417 B2 | 12/2014 | Yang | |
| 9,224,741 B2 | 12/2015 | Yang | |
| 2009/0148992 A1* | 6/2009 | Oyu | H01L 21/823412 438/268 |
| 2010/0264484 A1 | 10/2010 | Masuoka et al. | |
| 2011/0260259 A1* | 10/2011 | Masuoka | H01L 27/0924 257/369 |
| 2013/0134507 A1 | 5/2013 | Takaishi et al. | |
| 2015/0054066 A1 | 2/2015 | Yang | |
| 2016/0056173 A1* | 2/2016 | Masuoka | H01L 29/66666 257/203 |

FOREIGN PATENT DOCUMENTS

| | | |
|---|---|---|
| CN | 101866925 A | 10/2010 |
| CN | 101866925 B | 5/2012 |
| EP | 2242096 A2 | 10/2010 |
| JP | 4487221 B1 | 6/2010 |
| JP | 2010-251586 A | 11/2010 |
| TW | 201039435 A | 11/2010 |

\* cited by examiner

*Primary Examiner* — Daniel Whalen
(74) *Attorney, Agent, or Firm* — Robert Sullivan, Esq.; McGinn I.P. Law Group, PLLC

(57) ABSTRACT

A semiconductor and a method of forming a semiconductor on a single chip, including forming a shallow trench isolation (STI) region on a short channel device and a long channel device, forming at least two vertical fins connected in the long channel device, and forming contacts on a source and drain regions for the long channel device and short channel device, wherein the contacts connect a top surface of the source or drain region for series FET (Field-Effect Transistor) connection for the long channel device.

20 Claims, 7 Drawing Sheets

LONG CHANNEL AND SHORT CHANNEL VERTICAL FET CO-INTEGRATION FOR VERTICAL FET VTFET

BACKGROUND OF THE INVENTION

Field of the Invention

The present invention relates generally to a method and system for vertical FETs, and more particularly, but not by way of limitation, relating to a system, apparatus, and method for Long channel and short channel Vertical FET co-integration for vertical FET VTFET.

Description of the Related Art

Long Channel Devices are very difficult to fabricate in vertical channel transistor device chips. Long-channel MOSFET (metal-oxide-semiconductor field-effect transistor) can be, for example, devices with width and length long enough so that edge effects from the four sides can be neglected where channel length "L" must be much greater than the sum of the drain and source depletion widths. Short channel MOSFETs can be, for example, devices with width and length short enough such that the edge effects cannot be neglected. Channel length "L" is comparable to the depletion widths associated with the drain and source.

One of the proposals is to make vertically tall fin and thicker gate (long gate) for long channel device. However, it causes huge integration issues due to the different FIN height, STI (shallow trench isolation) height and gate patterning.

There is technology that does require long channel device, such as I/O (input/output) device co-integrated with short channel device on the same chip (SOC, system on chip). However, the manufacture of such devices has been very difficult. For example, it is difficult to have to two different gate lengths (Lg) because of etching and other difficulties with obtaining different gate lengths.

Therefore, there is a need for providing long and short channel devices in vertical channel transistor device chips that is easy to manufacture. There is also a need to provide I/O devices co-integrated with short channel device on the same chip (SOC).

SUMMARY OF INVENTION

In view of the foregoing and other problems, disadvantages, and drawbacks of the aforementioned background art, an exemplary aspect of the present invention provides a system, apparatus, and method of providing for system, apparatus, and method for Long channel and short channel Vertical FET co-integration for vertical FET (field-effect transistor) and VTFET (vertical-tunneling field-effect transistor).

One example aspect of the present invention provides a method of forming a semiconductor on a single chip, including forming a shallow trench isolation (STI) region on a short channel device and a long channel device, forming at least two vertical fins connected in the long channel device, and forming contacts on a source and drain regions for the long channel device and short channel device, wherein the contacts connect a top surface of the source or drain region for series FET (Field Effect Transistor) connection for the long channel device.

The method can further include forming a Silicon substrate for the both the long channel device and the short channel device, performing a vertical fin patterning on the substrate, forming a well defining a bottom source and drain regions by ion implantation for the short and long channel devices, forming a bottom spacer after the well formation for the short and long channel devices, forming a gate on the bottom spacer for the long and short channel devices, and forming a top spacer for the long and short channel devices.

In another example aspect of present invention, there is described a semiconductor chip, including a short channel device including a vertical FET (Field Effect Transistor), a long channel device comprising a second vertical FET (Field Effect Transistor) integrated with the short channel device. The long channel devices are a series connection of a plurality of short channel devices, and wherein the short channel and the long channel devices are co-integrated on a same chip.

In yet another example aspect of present invention, there is described a semiconductor device, including a short channel device being vertically formed, a long channel device being vertically formed and co-integrated with the short channel device on a same chip, wherein the long channel devices including a well, a plurality of vertical fins formed over the well, source and drain regions formed over a top surface of the plurality of fins, and a plurality of metal contacts connecting at least two of the plurality of fins.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF DRAWINGS

The exemplary aspects of the invention will be better understood from the following detailed description of the exemplary embodiments of the invention with reference to the drawings.

DETAILED DESCRIPTION OF A PREFERRED EMBODIMENTS

Figure 1:
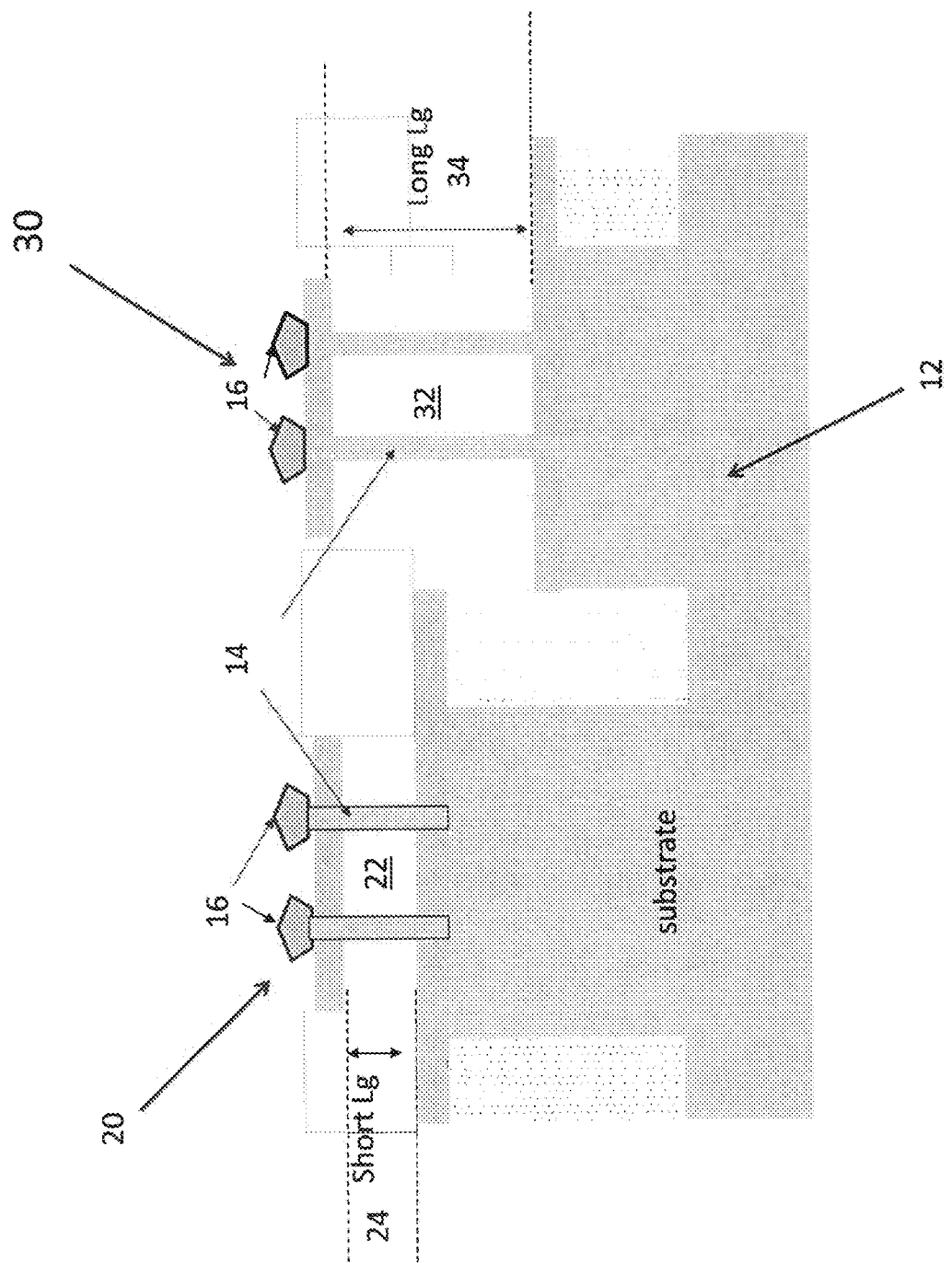
FIG. 1 illustrates a short channel device and a long channel device.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

FIG. 1 illustrates a short channel device and a long channel device. On a substrate 12, there is provided a vertical FET, single Lg (gate length) device (i.e., short channel) 20 and a vertical FET, long Lg (gate length) device (i.e., long channel) 30. The short gate length 24 of the gate layer 22 of the single Lg device 20 is provided. A long gate length Lg 34 of the gate layer 34 is provided on the long Lg device 30. A thin silicon fin 14 is provided in both devices 20 and 30. A top SD (symmetrically doped) portion 16 is provided on top of the fins 14.

Figure 2:
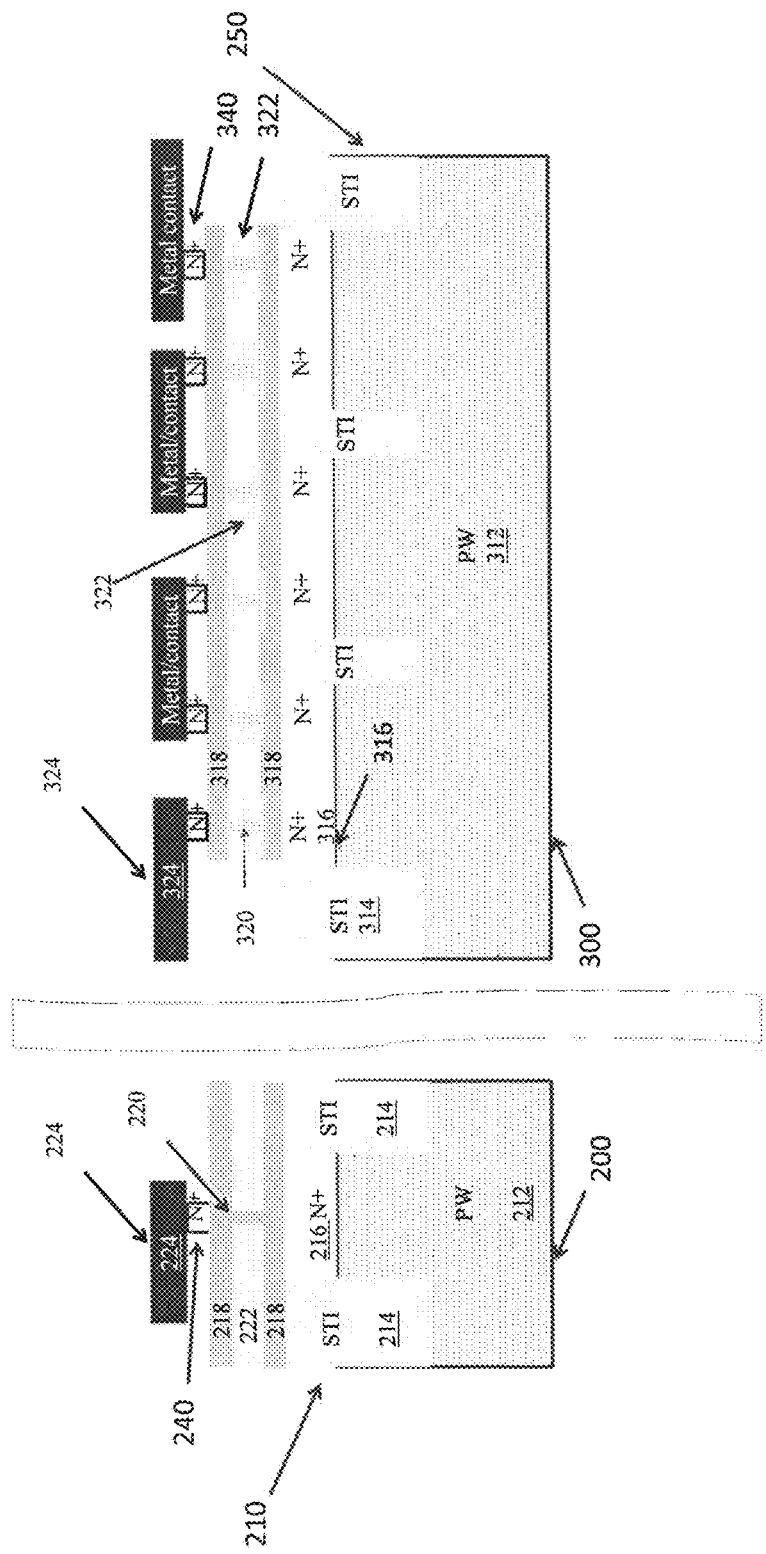
FIG. 2 illustrates the integrated short channel device and a long channel device in an example embodiment.

There is a need to build the long channel and short channel devices on the same chip. FIG. 2 shows a split view of the short channel device 210 and a long channel device 250 where both devices can be formed on a single wafer 250. In the VFET (vertical FET) short channel device 210, an nFET (n-type MOSFET), with a single FIN as an example is provided. A p-well (PW) 212 is formed on the substrate 250. An STI region 214 is formed along with N+ 216 doped region. Additionally, there are spacers 218 with the gate 222 formed there between. On top of the second spacer 218, there is an N+ doped region with metal/contact region 224 thereupon. Moreover, there is shown a single FIN 220.

A series of six FINs are provided as example and there can be more or less FIN numbers. Also, as compared to the nFET 200 shown in the illustration in FIG. 2, in pFET 300, there is a change of N+→P+, and PW→NW.

An p-well (PW) 312 is formed on the substrate. An STI region 314 is formed along with N+ 316 region. Additionally, there are spacers 318 with the gate 322 formed therebetween. On top of the second spacer 318, there is an N+ region 340 with metal/contact region 324 thereupon. Moreover, there is shown a plurality of FINs 320.

Figure 3:
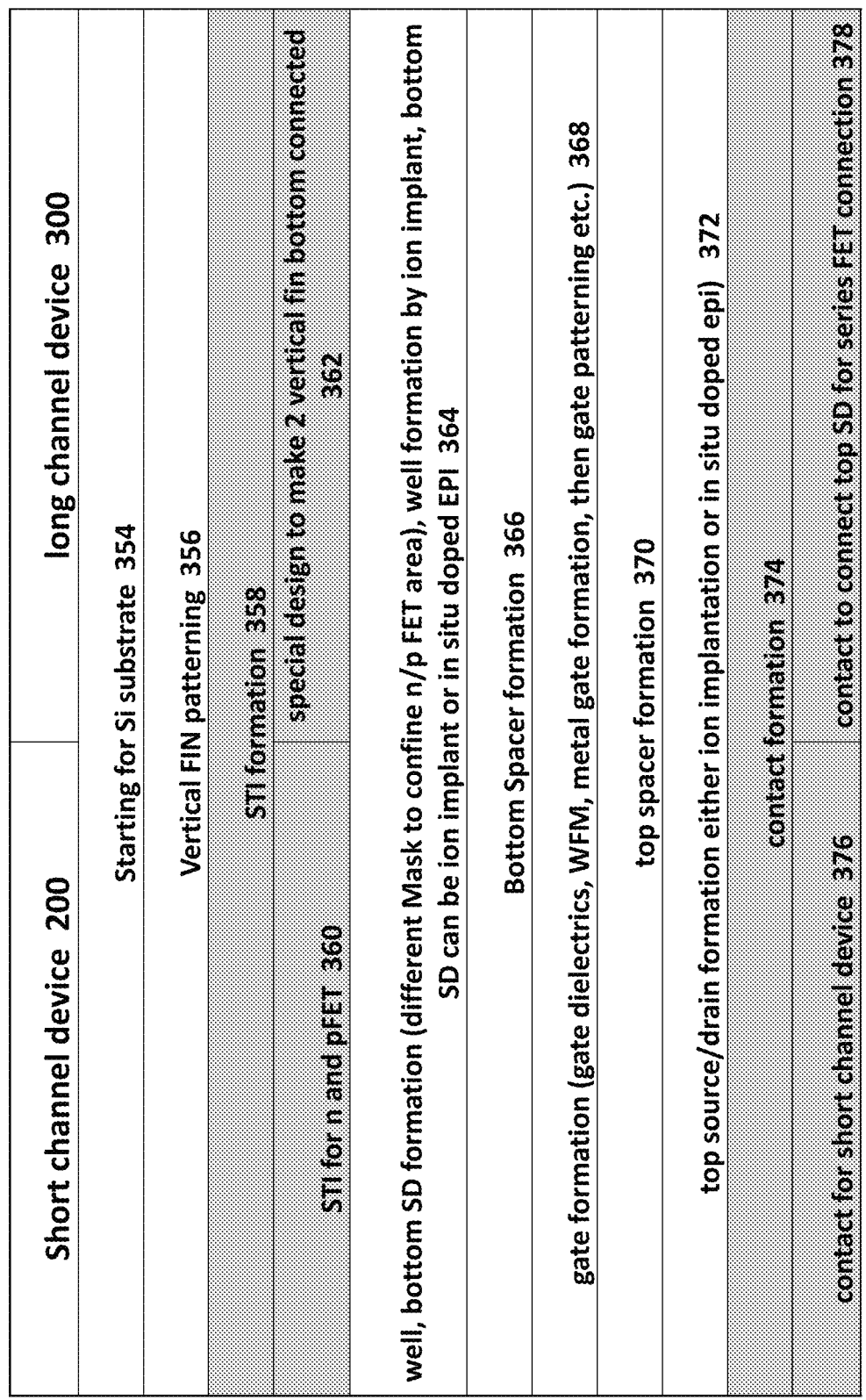
FIG. 3 illustrates a flow chart of forming the short channel and long channel device in the same chip in an example embodiment.

FIG. 3 illustrates a flow chart of forming the short channel and long channel device in the same chip in an example embodiment. The flow chart illustrates the commonality and differences between the formation of the short channel device 200 on the left side and the long channel device 300 on the right side of the flow chart. First, with the additional reference to FIG. 2, a single Silicon wafer 250 is started with in step 354. Then vertical FINs 220 and 320 are patterned for both the short channel device 200 and long channel device 300, respectively, in step 356. For example, a single FIN 220 can be patterned for the short channel device 200 and a plurality of FINs 320 can be patterned for the long channel device 300. In this example, six FINs 320 are patterned for the long channel device, but other configurations are possible for the short channel 200 and long channel devices 300.

Then, in step 358, the shallow trench isolation region is formed for both the short channel device 200 and the long channel device 300. The STI formation is modified further in the long channel device 300 in step 362 by making a special design to make at least two FINS 320 have their bottoms connected. In the short channel device 200, the STI region 214 is formed for n and p type FETs in step 360.

Then in step 364, the well 312 and 212 are formed for the long channel 300 and the short channel devices 200. The bottom source/drain region 216 and 316 are also formed with different masks to confine the n/p FET area. The well 212 and 312 formation can be by ion implantation, where the bottom source/drain region 364 can be by ion implant or in situ doped epitaxial growth.

In step 366, in the short channel device 200 and the long channel device 300, the bottom spacers 218 and 318 are respectively formed. Then, the gate 222 and 322 are formed in the short channel device 200 and the long channel device 300, respectively (step 368). The gate formation step 368 can include, for example, gate dielectrics, WFM (workfunction metal) grown, metal gate formation, then gate patterning and other steps.

Thereafter, in step 370 the top spacers 218 and 318 are formed above the gate 222 and 322, respectively. Then, in step 372, a top source/drain region 240 and 340 is formed on each of the FINs 220 and 320, respectively. The source/drain 240 and 40 for formed either by ion implantation or in situ doped epitaxial (epi).

Then in step 374 there is contact formation which subdivides into step 376 for the short channel device and 378 for the long channel device. In the long channel device 300, metal contacts 324 are formed connecting a top surface of the source/drain region 340 for series FET connection. For example, the metal contact 324 connects at least two of the adjacent top source/drain regions 340. Therefore, a series of small channel devices form the long channel device 300. For the short channel device 200, a metal contact 224 is formed on the top source/drain regions 240.

Figure 4:
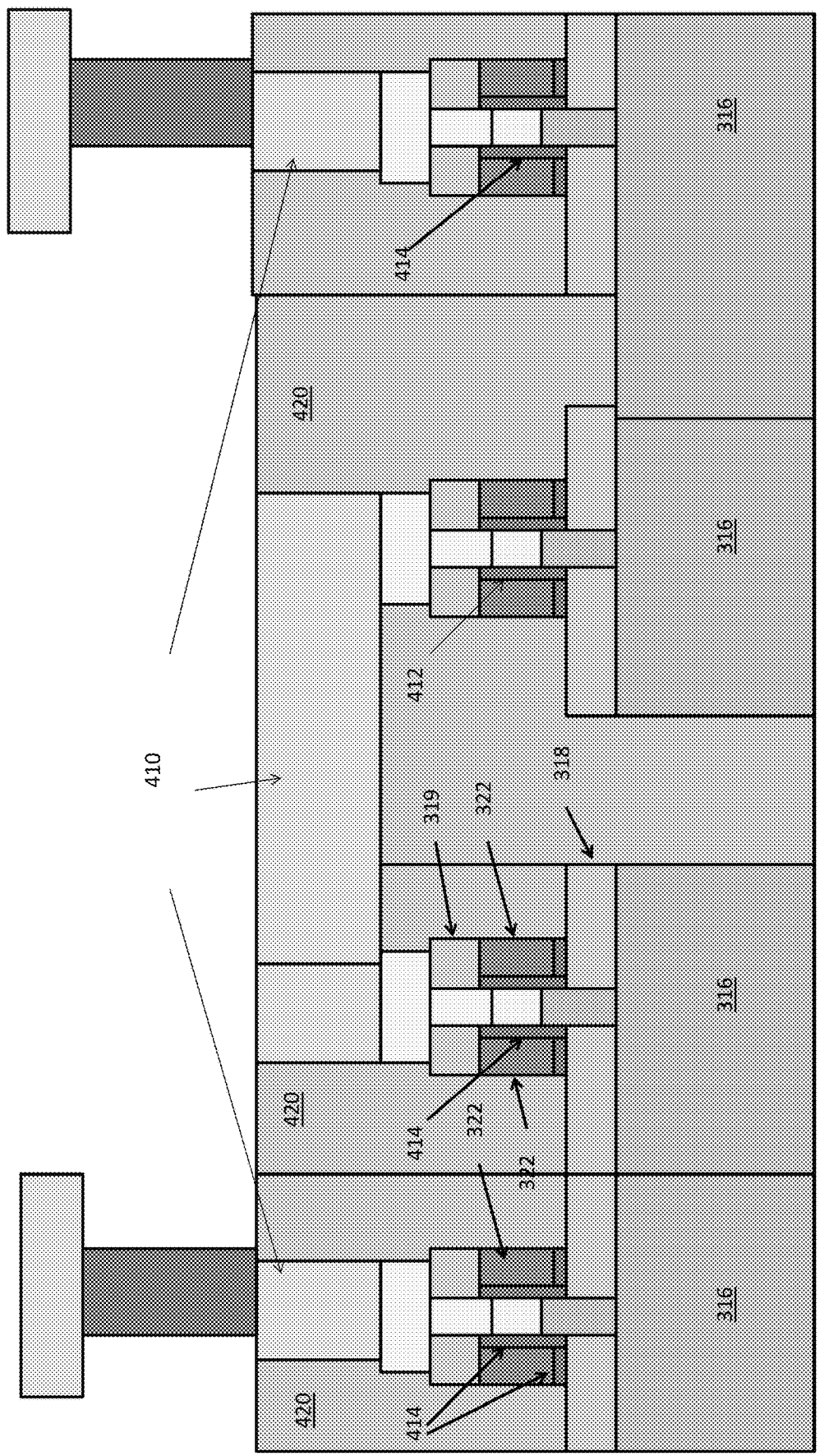
FIG. 4 illustrates another example embodiment of the integrated short and long channel device.

FIG. 4 illustrates another example embodiment of the integrated short and long channel device. The top series of contacts may be done with a local interconnect 410 for improved resistance and freeing up M1 wiring channels. This applies when more than two devices are in series and there is no need to contact the intermediate nodes.

The individual gates 322 are not physically merged. The gates 322 are physically separated. There are at least two advantages to this. This provides reduced parasitic capacitance. Another advantage is providing the option of accessing the gates separately for stacked-FET applications. A dielectric region 420 is also formed between sets of gates 322. Moreover, a high K dielectric region 414 can be formed around the gate region 322.

Figure 5:
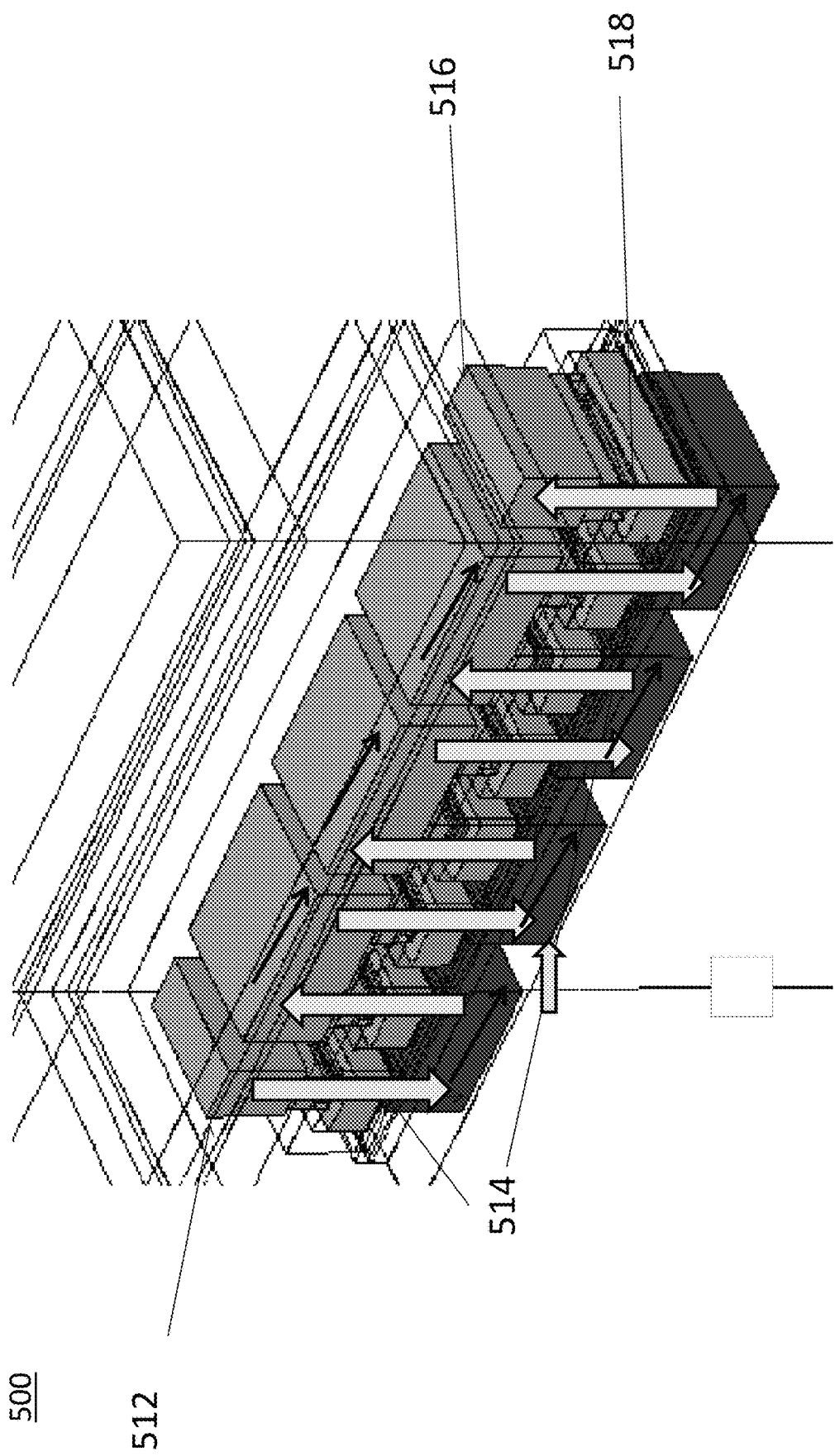
FIG. 5 illustrates the building of series FET in simulation.

FIG. 5 illustrates the building of series FET in simulation. The FET 500 includes a source 512, source 516, common gates 514, and the channel 518. The transport and all other parameters the same as for VTFET (except toxg=3.2 nm for I/O device).

Figure 6:
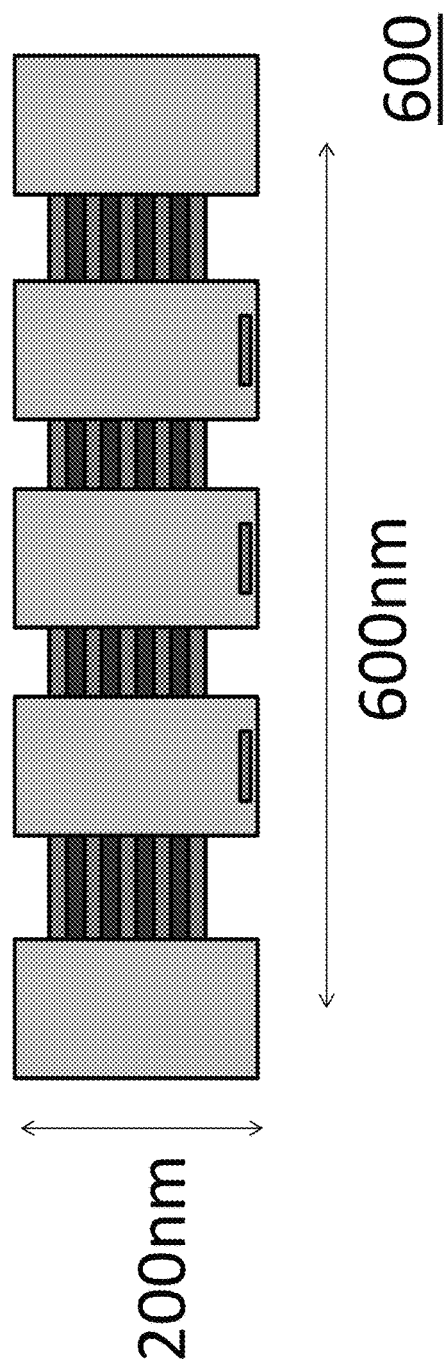
FIG. 6 illustrates a FinFET version.

FIG. 6 illustrates a FinFET 600 version. A height of 200 nm and width of 600 nm are provided. There are 3 fingers, 4 fins with 42 nm FP and Lg=150 (except toxg=3.2 nm for I/O devices and except thicker gate dielectrics for I/O devices.

Figure 7:
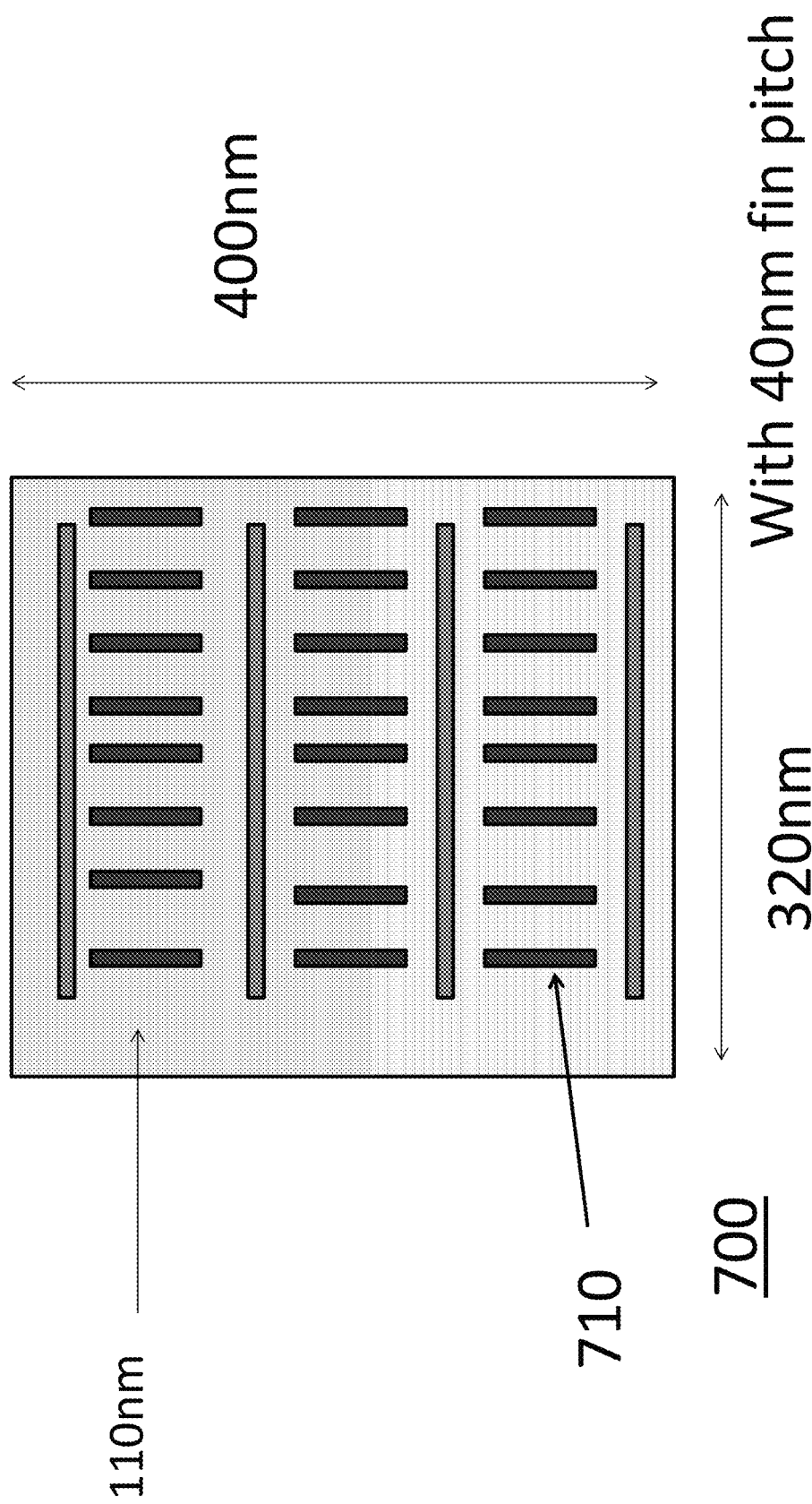
FIG. 7 illustrates a VFET version.

FIG. 7 illustrates a VFET 700 version. The height is 400 nm, and width 320 nm with a 40 nm fin pitch as seen in the FINs 710 provided. In this example, there are 8 (15 nm) gates in series and three (110 nm) fins in parallel. As seen in FIGS. 6 and 7, the present invention describes sheets rather than pillars, for more optimum area usage.

Series connection can be done with CA (contact level that couples circuit components' interconnects of the first metal level M1) instead of a M1 interconnect metal layer (applies for more than two FETs in series). Thick oxide for the gates and series device can be made for high voltage using the present invention. Additionally, the described configuration can be applied to make a thin oxide for the gate and series device for analog application. Moreover, stacked FETs (not common gate) can be made. The present invention can be sheets and not pillars for competitive area for high-drive applications. Therefore, the present invention describes sheets rather than pillars, for more optimum area usage. A combination of sheets and a gate connection shared between rows of sheets is more efficient in current per area than previously manufactured. The present invention can provide a planar layout for high current device with shared gate contact. Additionally, avoiding merging of the gate between fins can reduce capacitance.

There can be simultaneous appearance of all of these features on the same chip: single device with thin oxide; series devices (2 or more) with thin oxide for improved analog characteristics (gds and matching in particular); series devices (2 or more) with thicker gate oxide for high voltage application; stacked-FET devices (d-s in series but with independent gates), thick or thin-oxide stacked FETs. Therefore As shown above, both short channel and long channel devices are vertical FETs. Both short channel and long channel devices have same gate length (Lg). Long channel devices (for I/O, analog, etc) are series connected of short channel devices. In addition, short channel and long channel co-integration on same chip (SOC).

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor chip, comprising:
a short channel device comprising a first vertical FET (Field-Effect Transistor);
a long channel device comprising a second vertical FET integrated with a plurality of short channel devices;
a plurality of gates formed for the long channel device and a gate formed for the short channel device,
wherein the long channel device comprises a series connection of the plurality of short channel devices,
wherein the short channel device and the long channel device are co-integrated on a same chip,
wherein the long channel device comprises a plurality of series of fins that are bottom connected and integrated with each other while separating the plurality of gates;
a plurality of metal contacts connecting a top surface of source/drain regions for the plurality of series of fins in the long channel device; and
a second metal contact formed on a top source/drain region on the short channel device separate from the long channel device, and
wherein the gate of the short channel device and the plurality of gates of the long channel device have a same gate length.

2. The semiconductor chip according to claim 1 being a monolithic chip, wherein long channel and short channel devices form vertically stacked field effect transistors (FET), and
wherein the plurality of series of fins are parallel with each other, and
wherein the plurality of metal contacts connects at least two adjacent top surfaces of the source/drain regions and devoid of a contact with a top surface of a fin of the short channel device.

3. The semiconductor chip according claim 1, wherein the long channel device comprises the plurality of series of fins between spacers and gate regions,
wherein the short channel device comprises a fin through the spacer and the gate regions, and
wherein the plurality of gates of the long channel device includes a common gate.

4. The semiconductor chip according claim 1, wherein the plurality of series of fins includes at least two vertical fins that are formed with bottom portions connected in the long channel device,
wherein the plurality of series of fins of the long channel being connected with each other at a bottom portion of the plurality of series of fins while being separated from each other at a top portion of the plurality of series of fins, and
wherein the source/drain regions are formed over a top surface of the plurality of series of fins, and the plurality of metal contacts connecting the at least two vertical fins through the source/drain regions.

5. The semiconductor chip according claim 1,
wherein the plurality of metal contacts formed in the long channel device are electrically separate from the second metal contact in the short channel device,
wherein at least two adjacent top source or drain regions of the plurality of series of fins, which are not bottom connected by the bottom source or drain regions, are in electrical series connection by the metal contacts to provide a series connection for the long channel device, and
wherein the top source or drain region is in the short channel device.

6. The semiconductor chip according to claim 1, further comprising of:
a single silicon substrate for both the long channel device and the short channel device; and
physically separate the gates formed on the substrate.

7. The semiconductor chip according to claim 1, further comprising of a well formed and defining a bottom source/drain regions for the short and long channel devices.

8. The semiconductor chip according to claim 7, further comprising a bottom spacer on the well for the short and long channel devices.

9. The semiconductor chip according to claim 8, wherein the gates formed is on the bottom spacer for the long and short channel devices.

10. The semiconductor chip according to claim 9, further comprising:
a top spacer for the long and short channel devices;
the top source/drain regions formed on the top spacer.

11. The semiconductor chip according to claim 1, further comprising:
the plurality of series of fins formed in the long channel device; and
the top source/drain regions formed on each of the plurality of series of fins above the top spacer.

12. The semiconductor chip according to claim 1,
wherein the long channel device comprises the series connection of the plurality of short channel devices with a common gate,
wherein a local interconnect connects at a top layer for the series connection of the plurality of short channel devices, wherein the short channel device includes a fin, while the long channel device includes the plurality of series of fins, and wherein the short channel device is electrically separate from the long channel device.

13. A semiconductor device, comprising:
a short channel device being vertically formed;
a long channel device being vertically formed and co-integrated with the short channel device on a same chip;
a plurality of gates formed for the long channel device and a gate formed for the short channel device,
wherein the long channel device comprises:
a well;
a plurality of vertical fins formed over the well;
source or drain regions formed over top surfaces of the plurality of vertical fins; and
a plurality of metal contacts connecting at least two of the plurality of vertical fins,
wherein the long channel device comprises a plurality of series of vertical fins that are bottom connected with each other while separating the plurality of gates;
a plurality of metal contacts connecting top surfaces of the source or drain regions for the series connection of the fins in the long channel device; and
a second metal contact formed on a top source or drain region on the short channel device separate from the long channel device,
wherein the gate of the short channel device and the plurality of gates of the long channel device have a same gate length.

14. The semiconductor device according to claim 13, further comprising a plurality of sets of gates formed on the same chip, each set of gates being physically separated by a dielectric material, and
wherein the long channel device comprises a plurality of short channel devices forming a single transistor with a common gate,
wherein the short channel device includes a fin, while the long channel device includes the plurality of vertical fins,
wherein the plurality of metal contacts on the long channel device are separate from the second metal contact formed on the short channel device.

15. A semiconductor device on a single chip, the semiconductor comprising:
a shallow trench isolation (STI) region formed for a short channel device and a long channel device in a substrate;
at least two vertical fins connected in the long channel device;
a plurality of gates formed for the long channel device and a gate formed for the short channel device,
wherein a plurality of metal contacts connect top surfaces of the source or drain regions for a series FET (Field-Effect Transistor) connection for the long channel device,
wherein the long channel device comprises a plurality of series of fins that are bottom connected with each other while separating the plurality of gates,
wherein the gate of the short channel device and the plurality of gates of the long channel device have a same gate length,
the plurality of metal contacts connecting the top surfaces of the source or drain regions for the series connection of the fins in the long channel device; and
a second metal contact formed on a top source or drain region on the short channel device.

16. The semiconductor device according to claim 15, further comprising:
the plurality of gates physically separated by a dielectric material on the substrate,
wherein the substrate comprises a silicon substrate for the both the long channel device and the short channel device, and
wherein the long channel device comprises a plurality of short channel devices with a common gate.

17. The semiconductor device according to claim 16, wherein the at least two vertical fins are formed from the substrate by patterning, and
wherein the plurality of metal contacts on the long channel device are separate from the second metal contact formed on the short channel device.

18. The semiconductor device according to claim 17, further comprising a well defining a bottom source or drain region for the short and long channel devices.

19. The semiconductor device according to claim 18, further comprising a bottom spacer connected to the well for the short and long channel devices.

20. The semiconductor device according to claim 19, wherein the plurality of gates are formed on the bottom spacer for the long and short channel devices; and further comprising:
a top spacer formed for the long and short channel devices,
wherein the long channel device includes the plurality of series of fins that are bottom connected and integrated with each other.

* * * * *